(12) United States Patent
Jha et al.

(10) Patent No.: US 10,522,679 B2
(45) Date of Patent: Dec. 31, 2019

(54) SELECTIVE SHALLOW TRENCH ISOLATION (STI) FILL FOR STRESS ENGINEERING IN SEMICONDUCTOR STRUCTURES

(71) Applicant: GLOBALFOUNDRIES INC., Grand Cayman (KY)

(72) Inventors: Ashish Kumar Jha, Ballston Lake, NY (US); Hong Yu, Rexford, NY (US); Xinyuan Dou, Clifton Park, NY (US); Xusheng Wu, Ballston Lake, NY (US); Dongil Choi, Watervliet, NY (US); Edmund K. Banghart, Pittsford, NY (US); Md Khaled Hassan, Mechanicville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/797,380

(22) Filed: Oct. 30, 2017

(65) Prior Publication Data
US 2019/0131452 A1    May 2, 2019

(51) Int. Cl.
*H01L 29/78*  (2006.01)
*H01L 29/06*  (2006.01)
*H01L 27/092*  (2006.01)
*H01L 21/762*  (2006.01)
*H01L 21/8238*  (2006.01)
*H01L 29/66*  (2006.01)
*H01L 21/308*  (2006.01)
(Continued)

(52) U.S. Cl.
CPC .... *H01L 29/7846* (2013.01); *H01L 21/76224* (2013.01); *H01L 21/823821* (2013.01); *H01L 21/823878* (2013.01); *H01L 27/0922* (2013.01); *H01L 27/0924* (2013.01); *H01L 29/0649* (2013.01); *H01L 21/3065* (2013.01); *H01L 21/3081* (2013.01); *H01L 21/31116* (2013.01); *H01L 21/823828* (2013.01); *H01L 29/66545* (2013.01)

(58) Field of Classification Search
CPC ............. H01L 29/7846; H01L 27/0924; H01L 29/0649; H01L 27/0922; H01L 21/76224; H01L 21/823821; H01L 21/823878; H01L 21/31116; H01L 21/823828; H01L 21/3081; H01L 21/3065; H01L 29/66545
USPC ......... 257/368–369, 510, 351, 374; 438/359, 438/424–425, 296, 353, 435–437
See application file for complete search history.

(56) References Cited

U.S. PATENT DOCUMENTS

| | | | |
|---|---|---|---|
| 6,368,931 B1* | 4/2002 | Kuhn | H01L 21/3144 438/359 |
| 2006/0220142 A1* | 10/2006 | Tamura | H01L 21/76224 257/374 |

(Continued)

*Primary Examiner* — Nduka E Ojeh
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to selective shallow trench isolation (STI) fill material for stress engineering in semiconductor structures and methods of manufacture. The structure includes a single diffusion break (SDB) region having at least one shallow trench isolation (STI) region with a stress fill material within a recess of the at least one STI region. The stress fill material imparts a stress on a gate structure adjacent to the at least one STI region.

20 Claims, 5 Drawing Sheets

(51) Int. Cl.
*H01L 21/3065* (2006.01)
*H01L 21/311* (2006.01)

(56) References Cited

U.S. PATENT DOCUMENTS

| | | | | |
|---|---|---|---|---|
| 2007/0202663 A1* | 8/2007 | Moroz | ............ | H01L 21/823807 438/426 |
| 2007/0228488 A1* | 10/2007 | Kishii | ............... | H01L 21/76232 257/374 |
| 2009/0283852 A1* | 11/2009 | Gutmann | .......... | H01L 21/76232 257/510 |
| 2015/0021702 A1* | 1/2015 | Liu | .................... | H01L 29/0653 257/368 |
| 2017/0092728 A1* | 3/2017 | Kim | .................. | H01L 29/41791 |
| 2018/0108661 A1* | 4/2018 | Guo | .................... | H01L 27/0924 |

* cited by examiner

SELECTIVE SHALLOW TRENCH ISOLATION (STI) FILL FOR STRESS ENGINEERING IN SEMICONDUCTOR STRUCTURES

FIELD OF THE INVENTION

The present disclosure relates to semiconductor structures and, more particularly, to selective shallow trench isolation (STI) fill for stress engineering in semiconductor structures and methods of manufacture.

BACKGROUND

In a double diffusion break (DDB) structure, a lateral width (in the current transport direction or gate length direction of the FinFET devices) of the isolation material between two active regions approximately corresponds to the lateral width of two of the gate structures. On the other hand, in a single diffusion break (SDB), the lateral width (in the current transport direction or gate length direction of the FinFET devices) of the isolation material between the two active regions is less than the lateral width of a single gate structure.

In general, it is easier to form a DDB isolation structure than it is to form a SDB due to the relatively larger size of the DDB isolation structure. However, the use of such DDB isolation structures consumes more of the available space on a substrate than does the use of SDB isolation structures, thereby leading to reduced packing densities. Some integrated circuit products use both DDB and SDB isolation structures in different regions of a product. For example, logic regions of an integrated circuit product may employ SDB isolation structures, whereas SRAM regions may employ DDB isolation structures.

Moreover, SDB device performance is weaker compared to DDB devices. This is due to a weaker source and drain. The weaker device performance of SDB devices restricts its usage in the chip even though it has higher packaging density than DDB devices. Moreover, faceted source/drain poses another problem while trying to boost SDB device performance, particularly using junction elements. For example, faceted source/drain in SDB devices can lead to approximately an 8-10% performance gap compared to DDB devices because the source/drain is not fully grown in the facet.

SUMMARY

In an aspect of the disclosure, a structure comprises a single diffusion break (SDB) region comprising at least one shallow trench isolation (STI) region with a stress fill material within a recess of the at least one STI region, the stress fill material imparting a stress on a gate structure adjacent to the at least one STI region.

In an aspect of the disclosure, a structure comprises: a first single diffusion break (SDB) region comprising a shallow trench isolation (STI) region with a stress fill material that imparts a stress favorable to a SDB NFET device; and a second single diffusion break (SDB) region comprising a shallow trench isolation (STI) region with a stress fill material that imparts a stress favorable to a SDB PFET device.

In an aspect of the disclosure, a method comprises: forming at least one shallow trench isolation (STI) region in a single diffusion break (SDB) region: removing material from the at least one STI region to form a recess within the STI region; depositing a stress fill material within the recess of the at least one STI region; and forming a gate structure adjacent to the stress fill material, such that the stress fill material imparts a favorable stress on the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to selective shallow trench isolation (STI) fill material for stress engineering in semiconductor structures and methods of manufacture. More specifically, the present disclosure relates to STI fill material for stress engineering in single diffusion break (SDB) devices and methods of manufacture. Advantageously, the present disclosure provides improved SDB NFET/PFET performance using strain engineering while not affecting double diffusion break (DDB) device performance.

In embodiments, the STI fill material is provided near the SDB device to induce favorable stress in SDB NFET devices and SDB PFET devices, while having no impact on the DDB devices. That is, in embodiments, while making changes to the SDB STI, e.g., providing stress engineering, the DDB devices are masked by thick masking material, e.g., SiN layer, hence preventing any impact on the DDB region. The STI fill material can include a tensile stress material for an SDB NFET device or a compressive material for an SDB PFET device to boost device performance, and hence bridge the performance gap with a DDB device. In embodiments, the STI fill material can include a film or liner (or a dual liner) in an STI region of the structure, e.g., a film that provides a favorable stress for the SDB NFET device or SDB PFET device. In this way, the STI fill material between the DDB devices and the SDB devices are differentiated.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1:
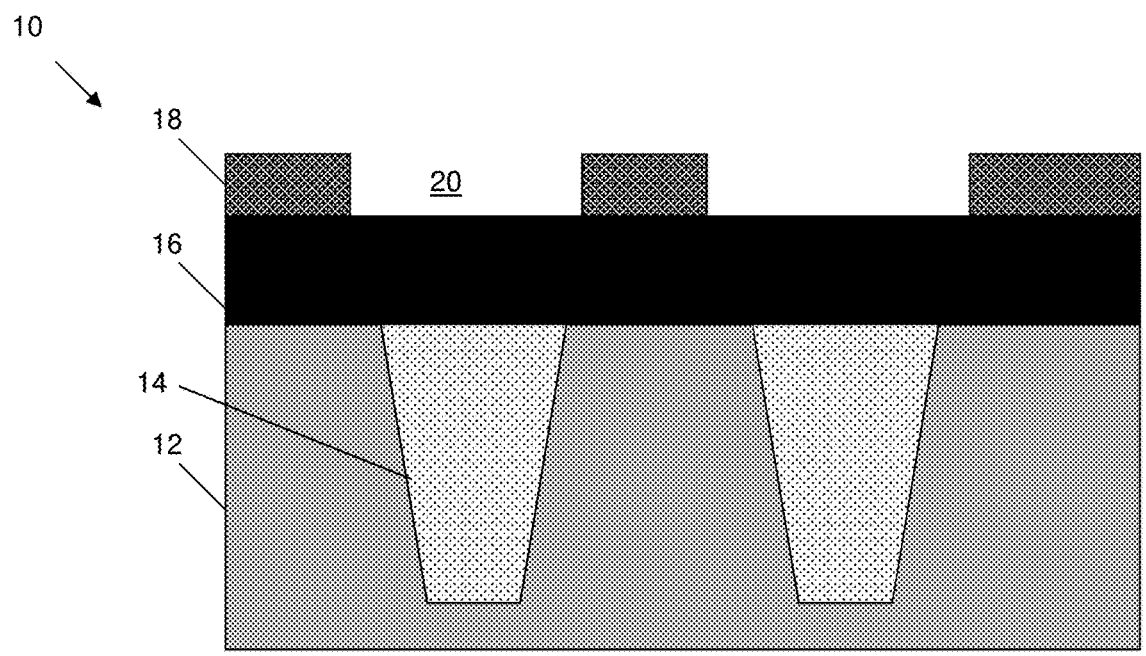
FIG. 1 shows a structure and respective fabrication processes in accordance with aspects of the present disclosure.

FIG. 1 shows a structure and respective fabrication processes in accordance with aspects of the present disclosure. In particular, the structure 10 of FIG. 1 includes a fin structure(s) 12 with STI regions 14. In embodiments, the fin structure 12 can be composed of any appropriate semiconductor substrate material. For example, the substrate material may be composed of any suitable material including, but not limited to, Si, SiGe, SiGeC, SiC, GaAs, InAs, InP, and other III/V or II/VI compound semiconductors.

In embodiments, the STI regions 14 can be fabricated using conventional CMOS processes, e.g., lithography, etching and deposition processes. For example, a resist formed over the substrate material is exposed to energy (light) to form a pattern (opening). An etching process with a selective chemistry, e.g., reactive ion etching (RIE), will be used to form one or more trenches in the substrate material through the openings of the resist. The resist can then be removed by a conventional oxygen ashing process or other known stripants. Following the resist removal, the insulator material (e.g., oxide) can be deposited by any conventional deposition processes, e.g., chemical vapor deposition (CVD) processes. Any residual material on the surface of the substrate material can be removed by conventional chemical mechanical polishing (CMP) processes.

Still referring to FIG. 1, the fin structure 12 can be fabricated using conventional lithography and etching processes including, e.g., a sidewall image technique (SIT). In an example of a SIT technique, a mandrel material, e.g., $SiO_2$, is deposited on the substrate using conventional CVD processes. A resist is formed on the mandrel material, and exposed to light to form a pattern (openings). A reactive ion etching is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the narrow fin structures 20, for example. The mandrels are removed or stripped using a conventional etching process, selective to the mandrel material. An etching is performed within the spacing of the spacers to form the sub-lithographic features. The sidewall spacers can then be stripped.

FIG. 1 further shows a masking layer 16 deposited on the fin structure 12 and STI regions 14. In embodiments, the masking layer 16 is a SiN mask. A resist stack 18 is formed on the masking layer, with openings 20 formed in alignment with the STI regions 14. In embodiments, the openings 20 are formed by conventional lithography processes.

Figure 2:
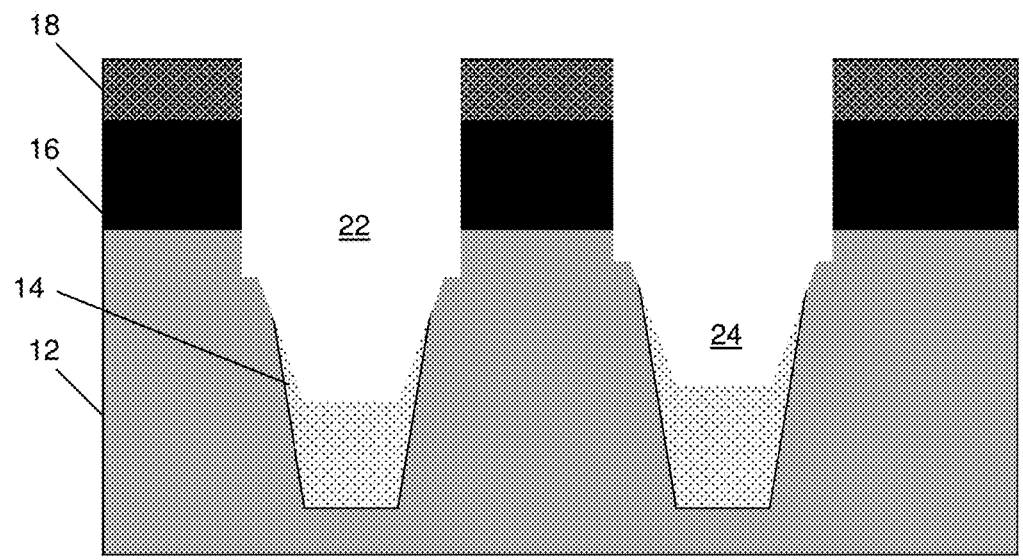
FIG. 2 shows recesses in STI regions, amongst other features, and respective fabrication processes in accordance with aspects of the present disclosure.

FIG. 2 shows a recess in the STI regions, amongst other features, and respective fabrication processes in accordance with aspects of the disclosure. More specifically, a recess 22 is formed in the fin structure 12 by a deep recess etching process. In embodiments, the deep recess etching process is a conventional reactive ion etching (RIE) with a chemistry to remove portions of the masking layer 16, underlying substrate material from the fin structure 12 and portions of the STI region 14, through the opening 20 of the resist stack 18. The depth of the recess 22 will depend on the technology node.

Still referring to FIG. 2, another etching process is performed to form a recess 24 in the STI regions 14. More specifically, the etching process will remove insulator material (e.g., oxide) from the STI regions 14, forming the recess 24. In embodiments, the oxide etching can be a dry etching process or a wet etching process. The recess 24 should be a partial recess of the STI regions 14, preferably about 20% to 60% of a depth of the STI regions 14; although other depths are also contemplated herein, including a complete removal of the oxide material.

Figure 3:
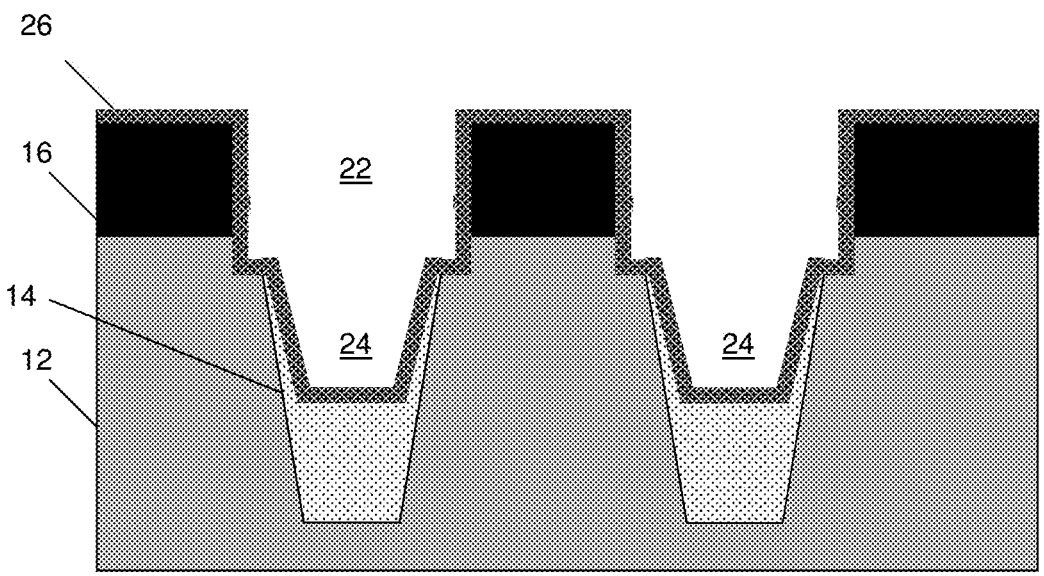
FIG. 3 shows an optional stress liner in the recesses of the STI regions, amongst other features, and respective fabrication processes in accordance with aspects of the present disclosure.

As shown in FIG. 3, an optional stress liner 26 is deposited in the recesses 22, 24 on surfaces of the masking layer 16, the substrate material of the fin structure 12 and on the oxide material in the STI regions 14. In embodiments, the stress liner 26 is formed by a blanket deposition process which will also cover the surface of the masking layer 16. For example, the stress liner 26 is deposited by a conventional atomic layer deposition (ALD) process or chemical vapor deposition (CVD) process, amongst other deposition processes. The stress liner 26 can be deposited to a thickness of about 3 nm to about 8 nm, depending on the requirements for device performance.

The stress liner 26 can be any material or combination of materials that will provide a favorable stress for SDB PFET devices and SDB NFET devices. For example, a compressive stress material can be used for SDB PFET devices; whereas, a tensile stress material can be used for SDB NFET devices. In embodiments, the materials can be, for example, nitride or oxynitride or other known insulator materials that can tune the stress components of the SDB PFET devices and SDB NFET devices. In embodiments, the stress liner 26 can be optional as another stress material is to be used to completely fill the recesses 22, 24.

Figure 4:
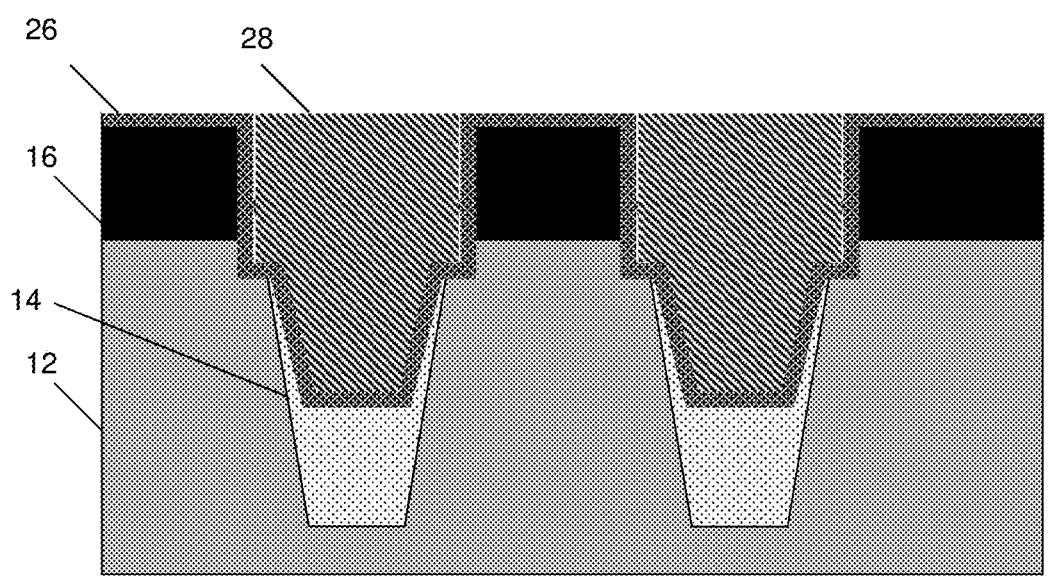
FIG. 4 shows a stress material in the recesses of the STI regions, amongst other features, and respective fabrication processes in accordance with aspects of the present disclosure.

In FIG. 4, a stress material 28 completely fills the recesses 22, 24. In embodiments, the stress material 28 can be deposited over the stress liner 26 or directly on the exposed surfaces of the STI regions 14, for example (when the liner is not used). In embodiments, the stress material 28 can be deposited by a conventional deposition method, e.g., CVD, followed by a planarization process, e.g., chemical mechanical polishing (CMP) and/or etch back process known to those of skill in the art.

The stress material 28 can be any material or combination of materials that will provide a favorable stress for SDB PFET devices and SDB NFET devices. For example, a compressive stress material can be used for SDB PFET devices; whereas, a tensile stress material can be used for SDB NFET devices. In embodiments, the stress material 28 can be separately deposited for the SDB PFET devices and SDB NFET devices to impart the appropriate stress (as described in more detail herein).

These stress materials 28 can be oxide materials or other insulator materials, e.g., other dielectric materials such as oxide or nitride based materials, which can be tuned for different stresses, as should be understood by those of skill in the art. In additional embodiments, the stress materials 28 can be deposited by different deposition processes, e.g., CVD and plasma enhanced CVD (PECVD) processes, to provide different stress components for the SDB PFET devices and SDB NFET devices. In further embodiments, the stress materials 28 can undergo an annealing process to provide different stress components. For example, anneal of a CVD oxide will result in a compressive stress; whereas, anneal of a nitride material will result in a tensile stress. These same processes and/or materials of the stress materials 28 can also be used for the stress liner 26.

Figure 5:
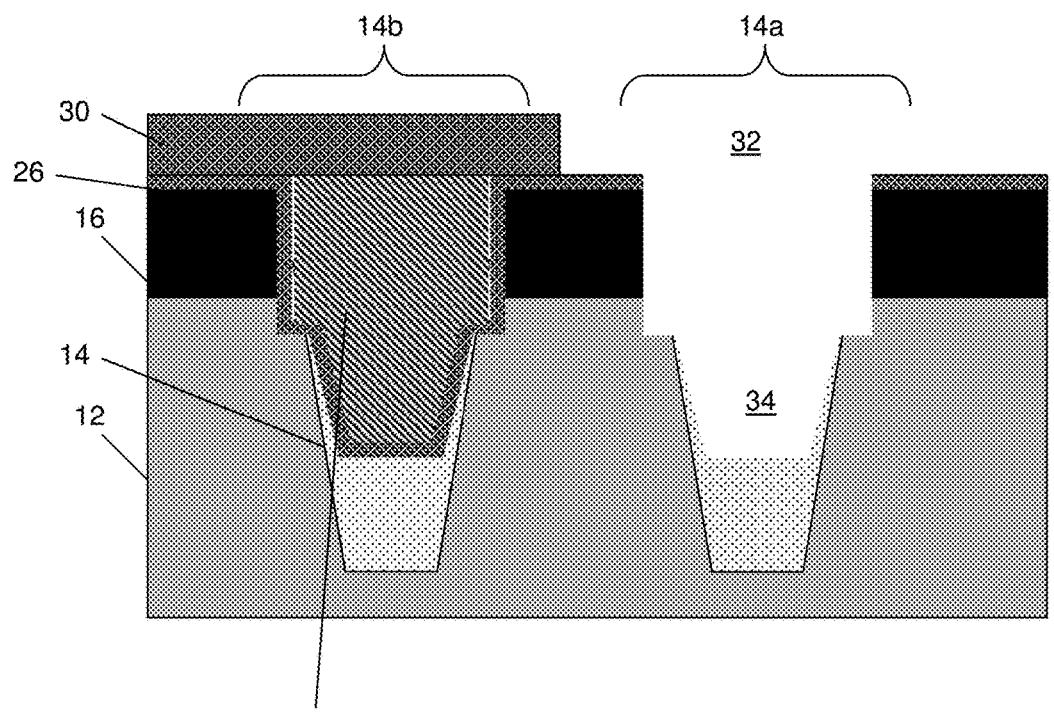
FIG. 5 shows stress material removed from one of the STI regions, amongst other features, and respective fabrication processes in accordance with aspects of the present disclosure.

In FIG. 5, a resist 30 is formed on the structure, followed by a lithography process resulting in an opening 32 formed over the STI region 14a. In embodiments, the STI region 14a can be associated with a SDB PFET device or SDB NFET device; whereas, the STI region 14b will be associated with a SDB NFET device or SDB PFET device, respectively. In embodiments, the STI regions 14a, 14b can be associated with a same type of device, noting that this process will be used to further adjust or tune a stress component for such devices, as further described herein.

Still referring to FIG. 5, the stress material 28 (and optional liner 26) is removed from the STI region 14a to form a recess 34. In embodiments, the stress material 28 (and optional liner 26) is removed by an etch-back process with chemistries that are selective to the stress material 28 (and optional liner 26). In this process, the masking layer 14 will protect the stress material 28 (and optional liner 26) over the STI region 14b (and any DDB isolation structures). The resist 30 can be removed after the etching process using conventional stripping processes.

Figure 6:
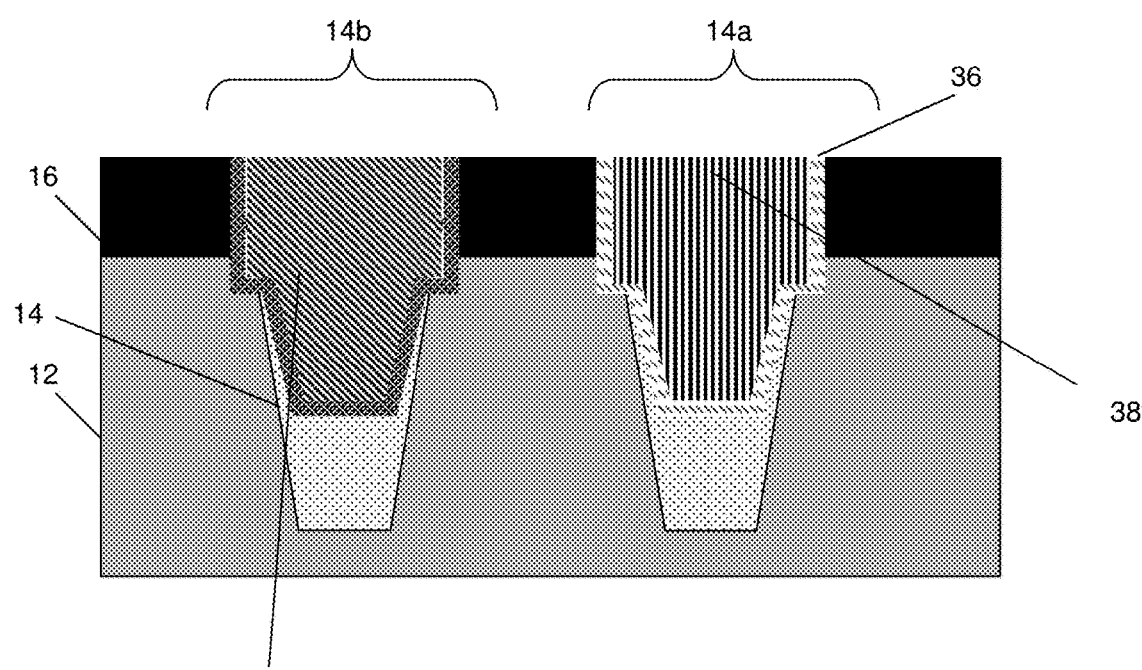
FIG. 6 shows different stress materials in the recesses of the STI regions, amongst other features, and respective fabrication processes in accordance with aspects of the present disclosure.

In FIG. 6, an stress liner 36 and a stress material 38 are deposited within the recess 34 using a blanket deposition process, e.g., CVD or other deposition processes as described herein. In embodiments, the stress liner 36 is optional, as stress material 38 is also used to fill the recess 34. The stress liner 36 and stress material 38 will have a different stress component than the stress material 28 (an optional stress liner 26), hence providing a favorable stress component to a SBD device, e.g., PFET or NFET, formed adjacent to the stress material 36. In embodiments, following the deposition process, the optional stress liner 36 and stress material 38 will be planarized, e.g., subjected to a CMP process. Accordingly, as shown in FIG. 6, the stress material 36 will now be in STI region 14a and the stress material 28 will now be in STI region 14b, each of which can have a favorable stress component for different SBD devices.

Figure 7:
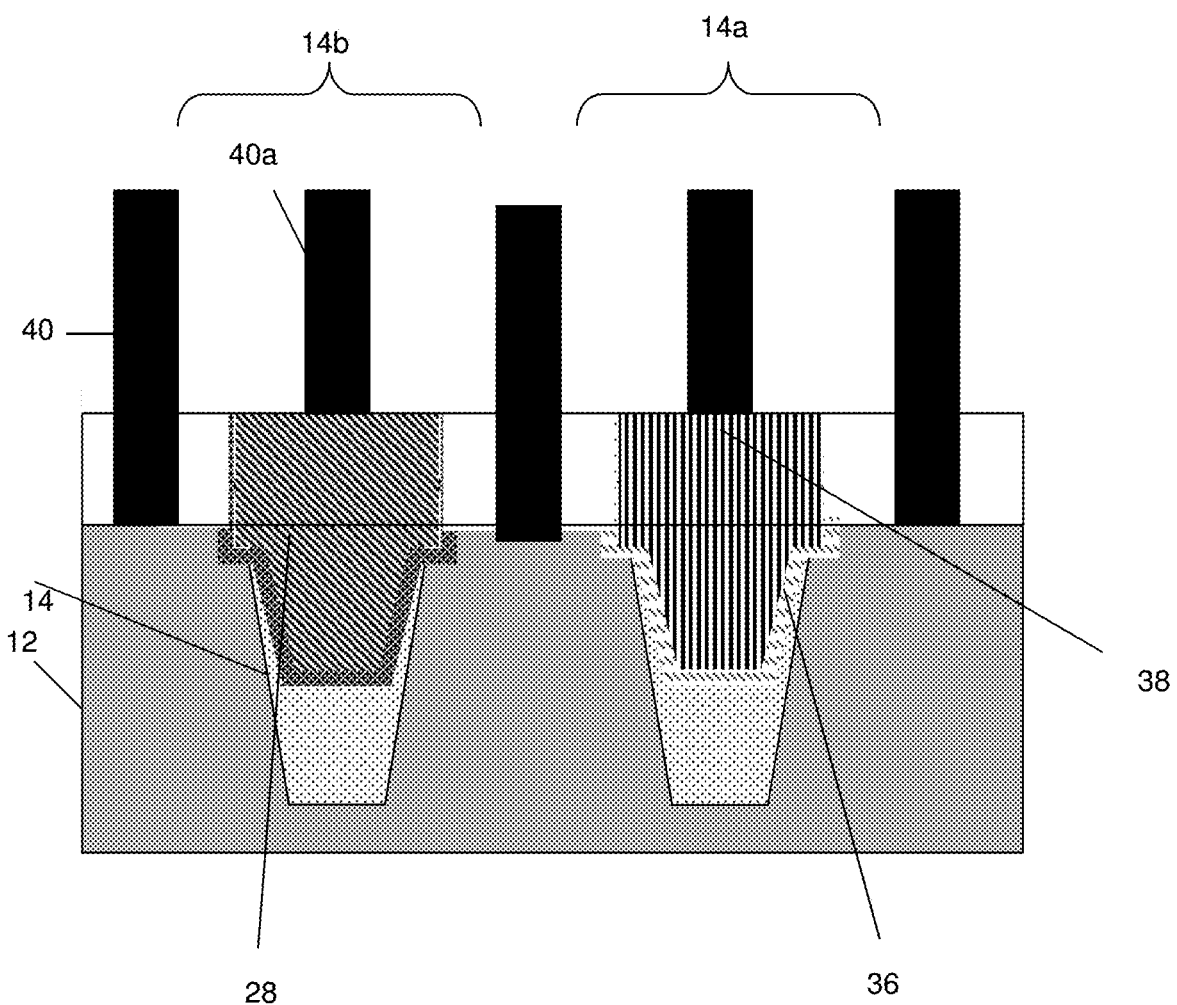
FIG. 7 shows single diffusion break (SDB) gate structures (and dummy gate structures) adjacent to selective shallow trench isolation (STI) fill for stress engineering, amongst other features, and respective fabrication processes in accordance with aspects of the present disclosure.

FIG. 7 shows different SDB gate structures, amongst other features, and respective fabrication processes in accordance with aspects of the present disclosure. For example, as shown in FIG. 7, the masking layer 16 is stripped, leaving raised stress material 28, 38 over the fin structure 12. In this stripping process the optional liners 26, 36 can also be removed from the surfaces of the fin structure 12 and vertical surfaces of the stress materials 28, 38.

By using conventional process of record, SDB gate structures 40, 40a can be formed over the fin structure 12, adjacent to the stress materials. In this way, the stress materials can impart a stress to the same or different SBD devices, as already described herein. It should be understood by those of skill in the art that the gate structures 40 directly on the stress material can be dummy gates; whereas, the gate structures 40 can be SBD devices, e.g., PFET or NFET having different stress components imparted thereon, depending on the engineered stress components provided by the STI fill processes described herein.

In embodiments, the process of record can include a replacement metal gate fabrication process, which is well known to those of skill in the art. For example, in embodiments, a high-k gate dielectric material can be deposited, followed by a deposition of gate material, e.g., specific workfunction metals. In embodiments, the high-k dielectric gate material can be a hafnium based dielectrics, as an example. In further embodiments, examples of such high-k dielectrics include, but are not limited: $Al_2O_3$, $Ta_2O_3$, $TiO_2$, $La_2O_3$, $SiTiO_3$, $LaAlO_3$, $ZrO_2$, $Y_2O_3$, $Gd_2O_3$, and combinations including multilayers thereof. Following the deposition process, source and drain epi regions can be fabricated using conventional growth processes and either an ion implantation or in-situ dopants. Contacts can also be fabricated using conventional silicide processes, followed by contact formation (e.g., deposition of metal material).

As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Figure 8:
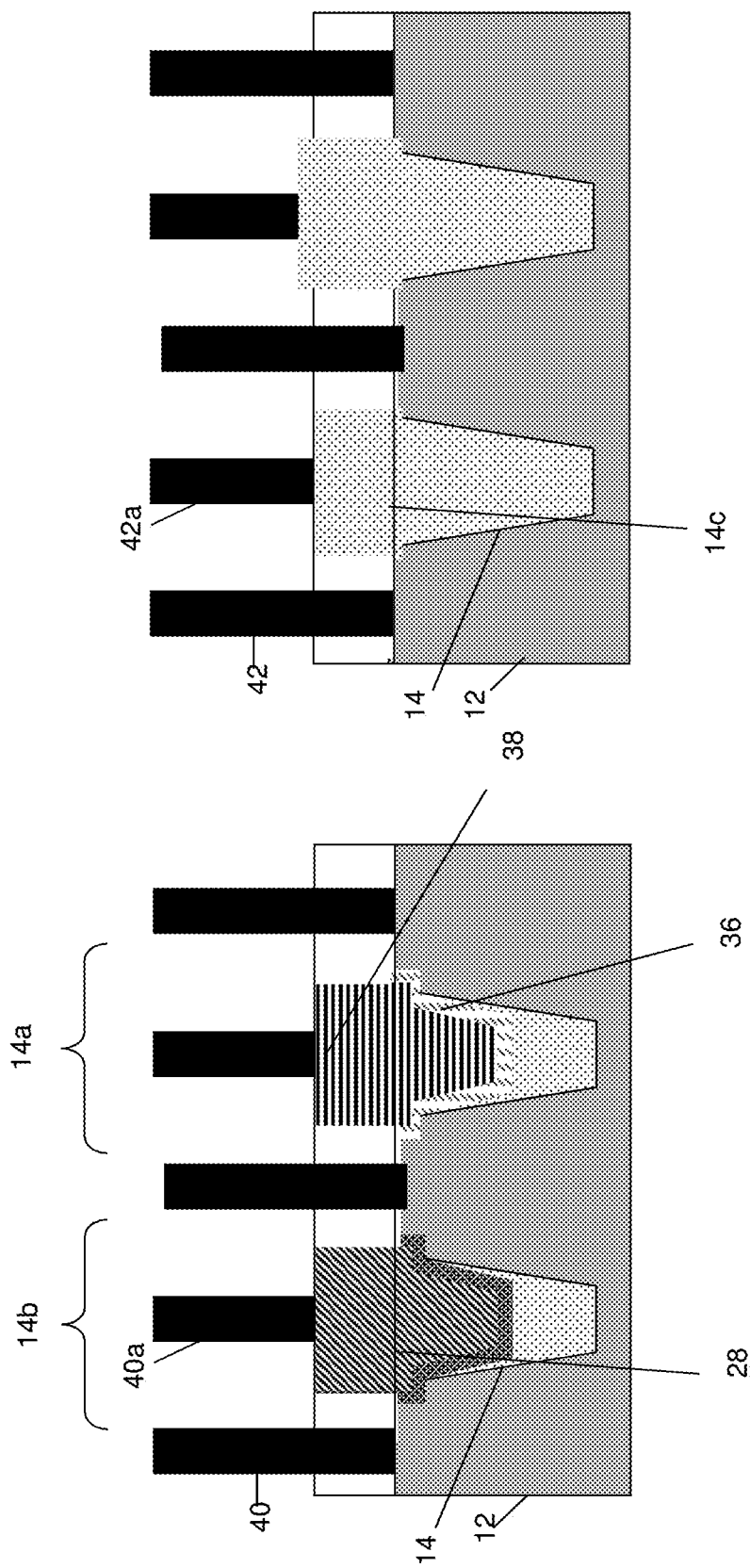
FIG. 8 shows SBD devices and double diffusion break (DDB) gate structures (adjacent to the conventional oxide fill material of STI regions), amongst other features, and respective fabrication processes in accordance with aspects of the present disclosure.

FIG. 8 shows SBD gate structures (and dummy gate structures) adjacent to the stress materials and DDB gate structures adjacent to the conventional oxide fill material of STI regions, amongst other features. More specifically, FIG. 8 shows a die that has SBD gate structures 40, 40a (adjacent to stress materials) and conventional DDB gate structures 42, 42a adjacent to conventional STI regions 14c. It should be recognized that the STI regions 14c will be fabricated in conventional processes (without stress fill material), and will also be protected by masking material during the stress engineering of the STI regions 14a, 14b as described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a single diffusion break (SDB) region comprising a plurality of shallow trench isolation (STI) regions partially filling trenches and a first stress fill material within a recess of a first STI region and a second stress fill material within a recess of a second STI region different from the first stress fill material, the first and second stress fill materials imparting a stress on a gate structure adjacent to the first and second STI regions.

2. The structure of claim 1, wherein the first stress fill material or the second stress fill material comprises a liner and a fill material within the recess of the first STI region or the second STI region.

3. The structure of claim 1, wherein the first stress fill material or the second stress fill material comprises a single material within the recess of the first STI region or the second STI region.

4. The structure of claim 2, wherein the recess is approximately 20% to 60% of a depth of the first STI region or the second STI region.

5. The structure of claim 1, wherein the first stress fill material exhibits a tensile stress on the gate structure or a compressive stress on the gate structure.

6. The structure of claim 1, wherein the first stress fill material is an insulator material.

7. The structure of claim 1, wherein:
the first stress fill material imparts a tensile stress; and
the second stress fill material imparts a compressive stress.

8. The structure of claim 1, further comprising a double diffusion break (DDB) region comprising an additional STI region with a non-stress fill material.

9. The structure of claim 1, further comprising a substrate that is a fin structure and the first STI region and the second STI region are etched in the fin structure, with the gate structure extending over the fin structure and adjacent to the first STI region and the second STI region.

10. The structure of claim 1, wherein the first stress fill material comprises a liner within the recess of the first STI region and a fill material deposited over the liner.

11. The structure of claim 10, further comprising a substrate that is a fin structure, wherein the first stress fill material and the second stress fill material are raised over the fin structure, the gate structure extends over the fin structure and wherein the liner is over an oxide fill of the at least one STI region.

12. A structure comprising:
a first single diffusion break (SDB) region comprising a trench and a first shallow trench isolation (STI) region in a bottom portion of the trench, and a first stress fill material within the trench and having opposing sides covered by the first STI region, the first stress fill material imparting a stress favorable to a SDB NFET device; and
a second SDB region comprising a second STI region with a second stress fill material that imparts a stress favorable to a SDB PFET device, wherein the first stress fill material is within a recces of the first STI region of the first SDB region, the second stress fill material being different from the first stress fill material and the first stress fill material is over an oxide fill within the recess.

13. The structure of claim 12, wherein the first stress fill material for the SDB NFET device has a tensile stress component and the second stress fill material for the SDB PFET device has a compressive stress component.

14. The structure of claim 12, wherein the first stress fill material and the second stress fill material include a liner and a fill material.

15. The structure of claim 12, wherein the first stress fill material and the second stress fill material are within a recess of the respective first and second STI regions.

16. The structure of claim 15, wherein the recess is approximately 20% to 60% of a depth of the respective first and second STI regions.

17. The structure of claim 12, wherein the first and second stress material are a single material.

18. The structure of claim 12, further comprising a double diffusion break (DDB) region comprising an additional STI region with a non-stress fill material.

19. The structure of claim 12, wherein the first STI region for the first SDB region and the second STI region for the second SDB region are within a fin structure of semiconductor material.

20. The structure of claim 19, wherein the SDB NFET device and the SDB PFET device extend over the fin structure, adjacent to the respective first and second STI regions.

* * * * *